United States Patent

Ueyama et al.

[11] Patent Number: 5,840,660
[45] Date of Patent: Nov. 24, 1998

[54] METHOD OF PREPARING BISMUTH OXIDE SUPERCONDUCTOR

[75] Inventors: Munestugu Ueyama; Kenichi Sato, both of Osaka, Japan; George E. Zahr, Glen Mills, Pa.

[73] Assignees: E.I. Du Pont De Nemours And Company, Wilmington, Del.; Sumitomo Electric Industries, Ltd., Japan

[21] Appl. No.: 430,552

[22] Filed: Apr. 28, 1995

Related U.S. Application Data

[63] Continuation of Ser. No. 966,025, filed as PCT/JP92/02280 Mar. 19, 1992, abandoned.

[30] Foreign Application Priority Data

Mar. 20, 1991 [JP] Japan ............................ 3-56691

[51] Int. Cl.$^6$ .................................................. C04B 33/32
[52] U.S. Cl. ...................... 505/470; 264/614; 264/669; 264/670; 427/62; 505/492; 505/501
[58] Field of Search ....................... 264/63, 66, 56, 264/614, 669, 670; 427/62; 505/470, 492, 501

[56] References Cited

U.S. PATENT DOCUMENTS

| | | | |
|---|---|---|---|
| 4,880,773 | 11/1989 | Itosaki et al. ............................. | 505/1 |
| 5,087,604 | 2/1992 | Shinga et al. ............................. | 505/1 |
| 5,100,866 | 3/1992 | Itozaki et al. ............................. | 505/1 |
| 5,104,849 | 4/1992 | Shiga et al. ............................. | 505/1 |
| 5,248,464 | 9/1993 | Alford et al. ............................. | 505/739 |

FOREIGN PATENT DOCUMENTS

| | | |
|---|---|---|
| A-0 283 197 | 9/1988 | European Pat. Off. . |
| A-0 450 443 | 10/1991 | European Pat. Off. . |
| A-01-230 404 | 9/1989 | Japan . |

OTHER PUBLICATIONS

Shiloh et al., "Formation of $(Ca_{1-x}Sr_x)_2PbO_4$ in Bi(Pb)–Sr–Ca–Cu–O system: Correlation with the formation of the 2223 high–$T_c$ phase", Journal Of Applied Physics, Sep. 1, 1990, USA, vol. 68, pp. 2304–2307.

*Primary Examiner*—Christopher A. Fiorilla
*Attorney, Agent, or Firm*—Pennie & Edmonds LLP

[57] ABSTRACT

Raw material powder for a bismuth oxide superconductor is molded with addition of an organic vehicle, and the molded raw material is heat treated for removing the organic vehicle before the molded raw material is metal-coated. In this heat treatment, conditions not more than those expressed as $T=-1.5 \times \log H + 600$ are applied as to relation between temperature (T) and time (H). Thus, phase transformation of 2212 phases mainly composing the raw material is suppressed so that a large amount of 2223 phases having a relatively high critical temperature are formed when heat treatment is performed after metal coating.

5 Claims, 2 Drawing Sheets

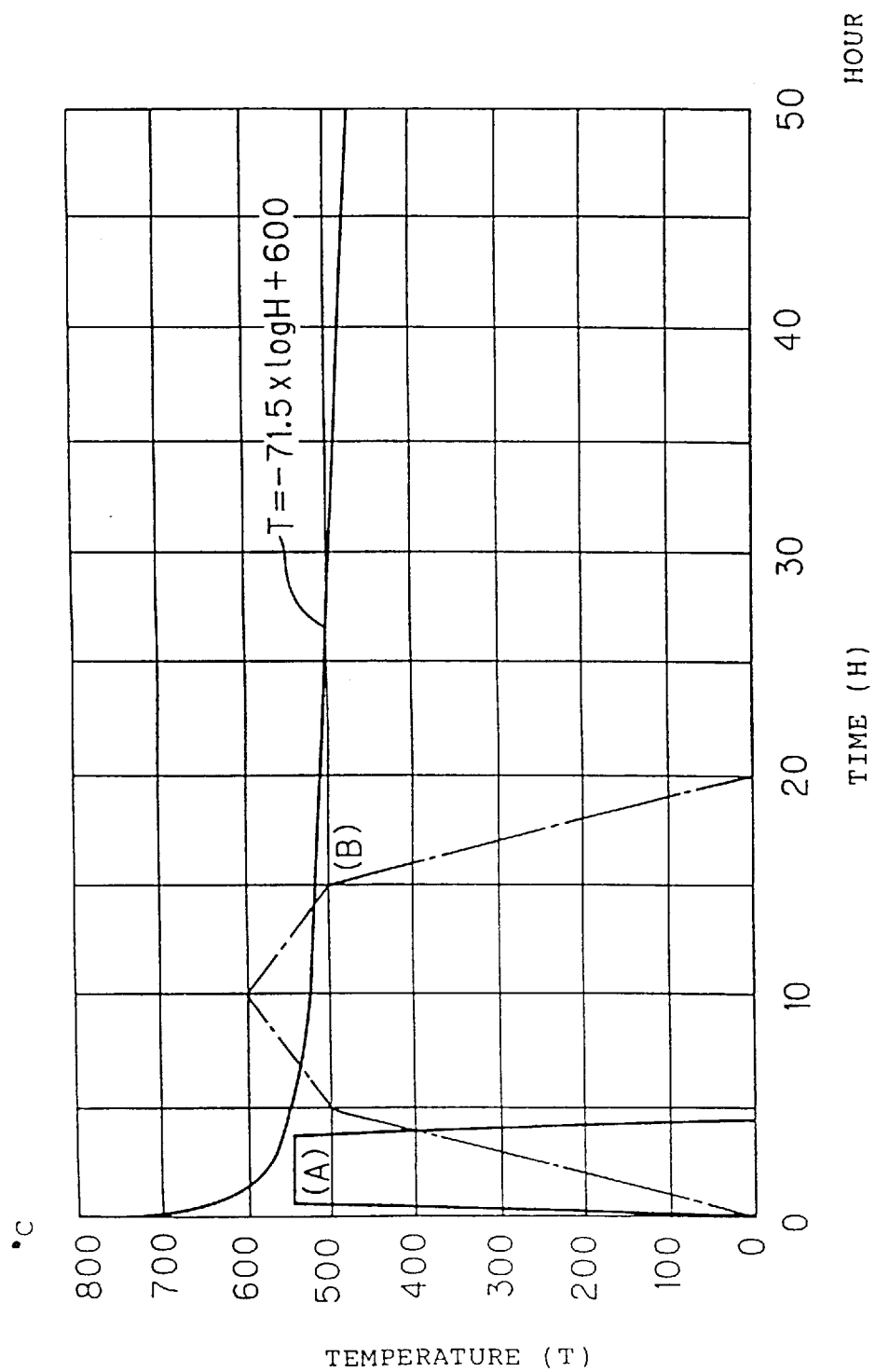

METHOD OF PREPARING BISMUTH OXIDE SUPERCONDUCTOR

This is a continuation-in-part, continuation of application Ser. No. 07/966,025, filed as PCT/JP92/0228 Mar. 19, 1992, now abandoned.

TECHNICAL FIELD

The present invention relates to a method of preparing a bismuth oxide superconductor, and more particularly, it relates to improvement in heat treatment conditions removing an organic vehicle which is added in order to mold raw material powder for a bismuth oxide superconductor.

BACKGROUND ART

In recent years, ceramic superconductive materials, i.e., oxide superconductive materials, are watched as superconductive materials which exhibit higher critical temperatures. For example, a bismuth oxide superconductive material, which has a high critical temperature of about 110K, is expected for practical use.

It is known that a bismuth oxide superconductor has a phase showing a critical temperature of 110K and those having critical temperatures of 80K and 10K. In relation to such a bismuth oxide superconductor, it is also known that the 110K phase has a 2223 composition in a composition of Bi—Sr—Ca—Cu, or (Bi, Pb)—Sr—Ca—Cu with partial substitution of Pb for Bi, while the 80K phase has a 2212 composition in the same composition.

In relation to a method of preparing an oxide superconductor, there is a method of performing deformation processing and heat treatment on raw material powder for an oxide superconductor, which is metal-coated with a metal sheath or the like, thereby bringing the metal-coated raw material into a superconductor state. This method is advantageously applied to preparation of a long superconducting wire, for example.

When such a long superconducting wire is prepared as described above, a pipe-shaped metal sheath is employed, for example. In this case, an organic vehicle is added to the raw material powder to mold the same into a billet, for example, so that the raw material powder can be easily filled into the metal sheath. The molded raw material, which is thus covered with the metal sheath and then heat treated in a later step, may generate gas during the heat treatment if the organic vehicle remains therein, to expand the metal sheath with the gas. Such expansion of the metal sheath may exert a bad influence on the oxide superconductor contained therein, to cause heterogeneity of properties in relation to the longitudinal direction of the oxide superconductor. Further, the residual organic vehicle prevents formation of superconducting phases.

Therefore, the organic vehicle must be removed before the molded raw material is inserted in the metal sheath. In order to remove the organic vehicle, the molded raw material is heat treated in general.

Since the 2223 phase having a 2223 composition exhibits a higher critical temperature as hereinabove described, it is preferable to form the largest possible amount of 2223 phases having the 2223 composition in preparation of a bismuth oxide superconductor, in order to provide a higher critical temperature thereby enabling stable maintenance of a superconducting state. However, it has been found that, in a method of heat treating a raw material for an oxide superconductor in a metal-coated state thereby bringing the metal-coated raw material into a superconducting state, a larger amount of 2223 phases can be formed after the heat treatment when the raw material to be metal-coated is prepared from that being mainly composed of 2212 phases and containing non-superconducting phases such as a (Ca, Sr)$_2$PbO$_4$ phase and a (Ca,Sr)$_2$CuO$_3$ phase and a small amount of 2223 phases rather than that being mainly composed of 2223 phases.

Therefore, the 2212 phases formed in the raw material must be so treated as to minimize the possibility of phase transformation in a stage before metal coating.

However, some of steps included in a method of preparing a bismuth oxide superconductor may cause phase transformation of the 2212 phases.

For example, the aforementioned heat treatment, which is carried out for removing the organic vehicle, may exert a bad influence on the 2212 phases. Namely, such heat treatment may form a larger amount of non-superconducting phases or cause unnecessary grain growth of superconducting phases, to reduce the content of the 2212 phases. Thus, 2223 phases having a relatively high critical temperature may not be efficiently formed even if the raw material is heat treated in a metal-coated state.

Further, when a bismuth oxide superconductor is heat treated in order to remove an organic vehicle which is mixed into raw material powder therefor, in general, this may lead to formation of a large amount of non-superconducting phases such as a (Ca,Sr)$_2$PbO$_4$ phase, a (Ca,Sr)$_2$CuO$_3$ phase and the like, formation of a 2201 phase having a critical temperature of 10K, or occurrence of unnecessary grain growth of superconducting phases in the raw material.

Accordingly, an object of the present invention is to provide conditions which can prevent occurrence of the aforementioned disadvantages, in relation to heat treatment for removing an organic vehicle included in a method of preparing a bismuth oxide superconductor. Disclosure of the Invention The method of preparing a bismuth oxide superconductor according to the present invention is characterized in that, when powder of a bismuth oxide superconductor is molded with addition of an organic vehicle which is prepared from an organic polymer or the like and the raw material is heat treated for removing the organic vehicle before the molded raw material is metal-coated, conditions are selected to be not more than those expressed as T=−71.5 ×logH+600 as to relation between temperature (T) and time (H).

The aforementioned heat treatment conditions are shown in FIG. 1. Referring to FIG. 1, the region shown with oblique lines indicates the heat treatment conditions applied in the present invention.

The raw material for the aforementioned bismuth oxide superconductor is generally prepared from a polycrystalline substance or an aggregate of superconducting and non-superconducting phases.

The above expression T=−71.5 ×logH+600 is an empirical formula which has been found through experiments. While FIG. 1 shows the heat treatment conditions in a semi-logarithmic scale, FIG. 2 shows the same in a natural scale. Referring to FIG. 2, (A) shows an exemplary heat treatment process which satisfies the conditions defined by the present invention. However, it has been confirmed through experiments that a heat treatment process shown by (B) in FIG. 2 also produces similar preferable results.

Thus, it is preferable to define the conditions not by a defining method simply depending on processing time and temperature, but with an integral value using relation between temperature and time, i.e., an area enclosed by a line showing threshold values of the heat treatment conditions in FIG. 2, so that preferable heat treatment conditions can be defined also in a case such as (B). When the above expression T=−71.5×logH+600 is integrated by the total processing time from zero to 20 in the case of (B), for example, the result is expressed as follows:

$$\int_0^{20} \{-71.5 \times \log H + 600\} dH$$

However, the aforementioned expression infinitely diverges with approach to zero, due to inclusion of "log". Therefore, the heat treatment conditions cannot be defined by such a simple integral. However, a definite value can be obtained by deciding the maximum temperature in the heat treatment. Thus, it is proper to set the maximum temperature at such a level that the raw material for the bismuth oxide superconductor starts melting, i.e., 860° C. Assuming that the maximum temperature is thus set at 860° C. and $h_0$ represents the total processing time in the heat treatment process, the following expression is obtained:

$$\int_a^{h_0} \{-71.5 \times \log H + 600\} dH + 860 \times a$$

The value a, which represents the time H with respect to the temperature of 860° C. in the above expression T=−71.5×logH+600, is found by the following expression:

$a = \exp\{2.3 \times (600-860)/71.5\} \approx 2.310 \times 10^{-4}$

Also when the heat treatment process such as (B) is carried out, therefore, the following conditions can be provided for the process, assuming that relation between temperature (T) [unit: °C.] and time (H) [unit: hour] is expressed as T=f(H):

$$\int_0^{h_0} f(H) dH \leq \int_a^{h_0} \{-71.5 \times \log H + 600\} dH + 860 \times a$$

Thus, according to the present invention, it is possible to suppress formation of non-superconducting phases, unnecessary grain growth of superconducting phases and formation of a 2201 phase in heat treatment for removing an organic vehicle.

When a raw material, from which an organic vehicle is removed in the aforementioned manner, is metal-coated and heat treated, 2223 phases having a relatively high critical temperature can be efficiently formed in a large amount.

Powder of the aforementioned raw material which is mixed with the organic vehicle is preferably not more than 2.0 μm in maximum particle diameter and not more than 1.0 μm in mean particle diameter.

The present invention further provides heat treatment conditions for removal of an organic vehicle, which can reduce the possibility of phase transformation of 2212 phases, in particular. When the heat treatment conditions are applied to a case of heat treating a raw material containing already obtained 2212 phases for removing an organic vehicle, therefore, the 2212 phases can be maintained with no formation of non-superconducting phases and no unnecessary grain growth of superconducting phases.

BRIEF DESCRIPTION OF THE DRAWINGS

FIG. 2 illustrates the relation shown in FIG. 1 in a natural scale, with two exemplary heat treatment processes within the scope of the present invention.

BEST MODES FOR CARRYING OUT THE INVENTION

EXAMPLE 1

Figure 1:
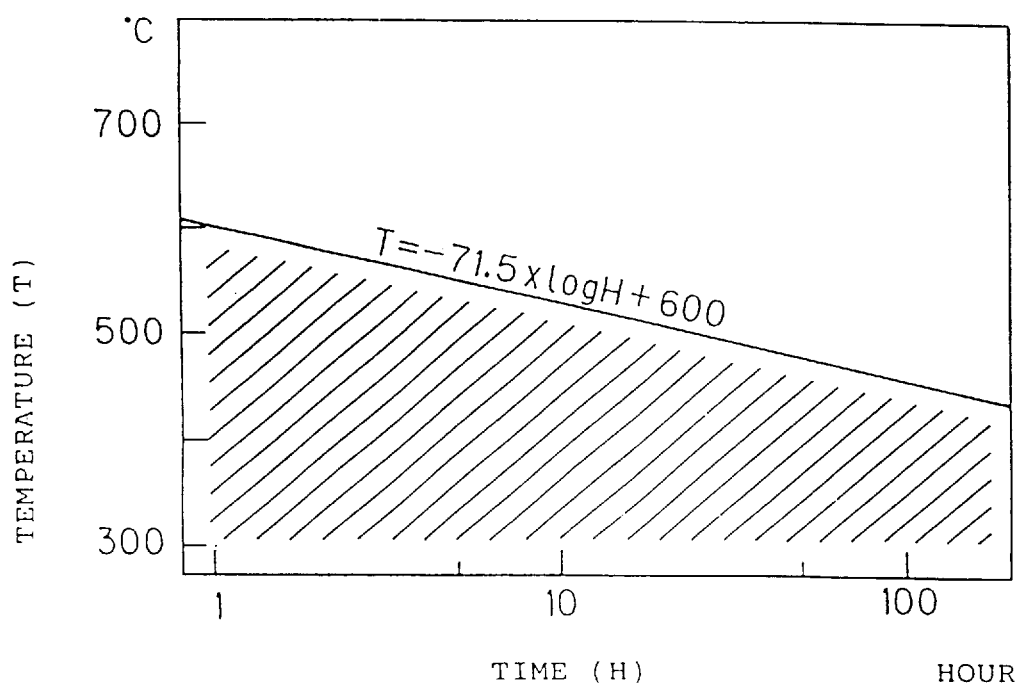
FIG. 1 illustrates relation between temperature (T) and time (H) employed in a step of performing heat treatment according to the present invention in a semi-logarithmic scale.

Respective powder materials of $Bi_2O_3$, PbO, $SrCO_3$, $CaCO_3$ and CuO were weighed and mixed with each other so that Bi, Pb, Sr, Ca and Cu were in the ratios of 1.8:0.4:2.0:2.2:3.0.

Then, the mixed powder was subjected to heat treatment at 800° C. for 8 hours, and further heat treated at 860° C. for 5 hours, to prepare powder containing 2212 and 2223 phases in the ratio of 83:17. This powder was subjected to X-ray diffraction measurement, whereby the ratio of the 2212 phases to non-superconducting phases was 100:10. The as-obtained powder was pulverized to be 1.8 μm in maximum particle diameter and 0.8 μm in mean particle diameter.

10 g of the as-obtained powder was introduced into 100 ml of methyl ethyl ketone, and mixed and dispersed through an ultrasonic bath with addition of two drops of a surface active agent (Sotex CW). Thereafter a solution of 2.8 g was prepared by mixing polyethylene carbonate in 40 ml of methyl ethyl ketone to be mixed with the aforementioned powder solution, so that the powder was dispersed in this solution. Thereafter this solution was evaporated until the same was brought into gummy paste, to prepare 20 cylindrical billets of 3.0 mm in diameter.

The respective ones of these billets were subjected to heat treatment under the following conditions, thereby removing the organic vehicles:

at 700° C. for 5 hours (sample No. 1)
at 650° C. for 10 hours (sample No. 2)
at 600° C. for 5 hours (sample No. 3)
at 550° C. for 5 hours (sample No. 4)
at 500° C. for 10 hours (sample No. 5)
at 750° C. for 1 hour (sample No. 6)
at 750° C. for 10 hours (sample No. 7)
at 750° C. for 20 hours (sample No. 8)
at 700° C. for 1 hour (sample No. 9)
at 650° C. for 1 hour (sample No. 10)
at 600° C. for 1 hour (sample No. 11)
at 600° C. for 10 hours (sample No. 12)
at 600° C. for 20 hours (sample No. 13)
at 550° C. for 1 hour (sample No. 14)
at 550° C. for 2 hours (sample No. 15)
at 550° C. for 10 hours (sample No. 16)
at 550° C. for 20 hours (sample No. 17)
at 500° C. for 1 hour (sample No. 18)
at 500° C. for 2 hours (sample No. 19)
at 500° C. for 5 hours (sample No. 20)

The respective samples were subjected to X-ray diffraction measurement, to recognize that the ratios of 2212 phases to non-superconducting phases were 100:10 in the samples Nos. 4, 5, 11, 14, 15, 18, 19 and 20, while the ratios of 2212 phases to non-superconducting phases were 100:32, 100:16, 100:14, 100:25, 100:33, 100:43, 100:31, 100:16, 100:15, 100:18, 100:15 and 100:17 in the samples Nos. 1, 2, 3, 6, 7, 8, 9, 10, 12, 13, 16 and 17 respectively. Thus, the ratios of the non-superconducting phases were increased by performing heat treatment.

Among the billets from which the organic vehicles were thus removed, each of the typical samples Nos. 1 to 5 was filled up in a silver pipe of 6.0 mm in outer diameter and 4.0 mm in inner diameter, then drawn into 1.0 mm in diameter, further rolled into 0.3mm in thickness, thereafter heat treated at 845° C. for 50 hours, further rolled into 0.15 mm in thickness, and then again heat treated at 840° C. for 50 hours.

As to the respective wires (samples No. 1 to No. 5), critical currents and critical current densities in a zero magnetic field were measured under a temperature of 77.3K respectively. Table 1 shows the results.

TABLE 1

| Sample No. | Critical Current (A) | Critical Current Density (A/cm$^2$) |
| --- | --- | --- |
| 1 | 2.0 | 2000 |
| 2 | 2.3 | 2300 |
| 3 | 1.8 | 1800 |
| 4 | 12.0 | 12000 |
| 5 | 13.0 | 13000 |

As shown in Table 1, the samples No. 4 and No. 5, which were heat treated under the conditions within the region shown with oblique lines in FIG. 1, attained higher critical currents and critical current densities as compared with the remaining samples. Thus, it is understood possible to obtain a bismuth oxide superconductor which exhibits a higher critical current as well as a higher critical current density according to the present invention.

EXAMPLE 2

Respective powder materials of $Bi_2O_3$, PbO, $SrCO_3$, $CaCO_3$ and CuO were weighed and mixed with each other so that Bi, Pb, Sr, Ca and Cu were in the ratios of 1.8:0.4:2.0:2.2:3.0.

Then, the mixed powder was subjected to heat treatment at 800° C. for 8 hours, and further heat treated at 860° C. for 5 hours, to prepare powder containing 2212 and 2223 phases in the ratio of 83:17. The as-obtained powder was pulverized to be 1.8 μm in maximum particle diameter and 0.8. μm in mean particle diameter.

Thereafter gummy paste was prepared similarly to Example 1, and this paste was introduced into a vessel of stainless steel provided with a hole of about 3.0 mm in diameter and extruded, to prepare a cylindrical billet of 3.0 mm in diameter.

The temperature of the as-obtained billet was raised up to 510° C. at 180° C./h., thereafter raised up from 510° C. to 550° C. at 8° C./h., thereafter reduced from 550° C. to 510° C. at 8° C./h., and cooled down from 510° C. to 30° C. at 180° C./h., to remove the organic vehicle.

The billet, from which the organic vehicle was thus removed, was filled in a silver pipe of 6.0 mm in outer diameter and 4.0 mm in inner diameter, then drawn into 1.0 mm in diameter, further rolled into 0.3 mm in thickness, thereafter heat treated at 845° C. for 50 hours, further rolled into 0.15 mm in diameter, and then again heat treated at 840° C. for 50 hours.

The as-obtained wire was subjected to measurement of a critical current and a critical current density in a zero magnetic field under a temperature of 77.3K, whereby a critical current value of 12.5 A and a critical current density value of 12500 A/cm$^2$ were obtained. These values are comparable to the critical currents and the critical current densities of the samples Nos. 4 and 5 shown in Table 1 in relation to Example 1.

This Example 2 was heat treated under conditions not satisfying the conditions not more than those expressed as $T=-71.5\times\log H+600$, but satisfying the following expression:

$$\int^{Oho}_{} f(H)dH \leq \int_a^{ho}\{-71.5\times\log H+600\}dH+860\times a$$

as the case of (B) shown in FIG. 2, so that the organic vehicle was removed.

Industrial Applicability

The method of preparing a bismuth oxide superconductor according to the present invention can be advantageously applied to heat treatment for removing an organic vehicle which is mixed in molding of a raw material filled up in a metal sheath, in preparation of an oxide superconducting wire.

We claim:

1. A method of preparing a bismuth oxide superconductor comprising the steps of:

preparing raw material powder for a bismuth oxide superconductor, said raw material having a composition for preparing a 2212 phase of Bi—Sr—Ca—Cu—O or (Bi, Pb)—Sr—Ca—Cu—O and a 2223 phase of Bi—Sr—Ca—Cu—O or (Bi, Pb)—Sr—Ca—Cu—O;

heating said raw material powder to prepare a bismuth oxide superconductor powder containing 2212 and 2223 phases, wherein the amount of said 2212 phase is larger than that of said 2223 phase;

adding an organic vehicle to said bismuth oxide superconductor powder;

molding said bismuth oxide superconductor powder; and removing said organic vehicle by heat treating said molded bismuth superconductor powder under conditions not more than those expressed as $T=-71.5\times\log H+600$, wherein T denotes temperature of the heat treatment (°C.) and H denotes time of heat treatment.

2. A method of preparing a bismuth oxide superconductor in accordance with claim 1, further comprising a step of metal-coating said molded raw material from which said organic vehicle is removed.

3. A method of preparing a bismuth oxide superconductor in accordance with claim 1, wherein said temperature (T) is not more than 860° C.

4. A method of preparing a bismuth oxide superconductor comprising the steps of:

preparing raw material powder for a bismuth oxide superconductor, said raw material having a composition for preparing a 2212 phase of Bi—Sr—Ca—Cu—O or (Bi, Pb)—Sr—Ca—Cu—O and a 2223 phase of Bi—Sr—Ca—Cu—O or (Bi, Pb)—Sr—Ca—Cu—O, heating said raw material powder to prepare a bismuth oxide superconductor powder containing 2212 and 2223 phases, wherein the amount of said 2212 phase is larger than that of said 2223 phase;

adding an organic vehicle to said bismuth oxide superconductor powder;

molding said bismuth oxide superconductor powder; and removing said organic vehicle by heat treating said molded bismuth superconductor powder under conditions satisfying:

$$\int_o^{h_o} f(h)dH \leq \int_a^{h_o} \{-71.5 \times \log H + 600\}dH + 860 \times a$$

wherein the heat treatment temperature $T \leq 860°$ C., and $$a = \exp\{2.3 \times (600-860)/71.5 = 2.130 \times 10^{-4}$$

wherein the total time of heat treatment is expressed as $h_o$ and the relation between temperature (T) (°C.) and time (H) (hours) is expressed as T=f(H).

5. A method of preparing a bismuth oxide superconductor in accordance with claim 4, further comprising a step of metal-coating said molded raw material from which said organic vehicle is removed.

* * * * *

UNITED STATES PATENT AND TRADEMARK OFFICE
CERTIFICATE OF CORRECTION

PATENT NO. : 5,840,660

DATED : November 24, 1998

INVENTOR(S) : Munetsugu Ueyama; Kenichi Sato; George E. Zahr

It is certified that error appears in the above-identified patent and that said Letters Patent is hereby corrected as shown below:

On the title page, [75] Inventors, please amend "Munestugu Ueyama" to -- Munetsugu Ueyama --.

At column 6, line 38, please amend "bismuth superconductor" to -- bismuth oxide superconductor --.

At column 6, line 66, please amend "bismuth superconductor" to -- bismuth oxide superconductor --.

Signed and Sealed this

Third Day of August, 1999

Attest:

Q. TODD DICKINSON

*Attesting Officer*  *Acting Commissioner of Patents and Trademarks*